United States Patent
Honma (10) Patent No.: US 8,599,670 B2
(45) Date of Patent: Dec. 3, 2013

(54) VITERBI DETECTOR AND INFORMATION REPRODUCING APPARATUS

(75) Inventor: Hiromi Honma, Tokyo (JP)

(73) Assignee: NEC Corporation, Tokyo (JP)

( * ) Notice: Subject to any disclaimer, the term of this patent is extended or adjusted under 35 U.S.C. 154(b) by 977 days.

(21) Appl. No.: 12/598,354

(22) PCT Filed: May 15, 2008

(86) PCT No.: PCT/JP2008/058899
§ 371 (c)(1),
(2), (4) Date: Oct. 30, 2009

(87) PCT Pub. No.: WO2008/140110
PCT Pub. Date: Nov. 20, 2008

(65) Prior Publication Data
US 2010/0135142 A1    Jun. 3, 2010

(30) Foreign Application Priority Data
May 15, 2007   (JP) .................................. 2007-129360

(51) Int. Cl.
*G11B 20/10* (2006.01)

(52) U.S. Cl.
USPC ...................................................... 369/59.22

(58) Field of Classification Search
None
See application file for complete search history.

(56) References Cited

U.S. PATENT DOCUMENTS

| | | | |
|---|---|---|---|
| 6,111,835 A * | 8/2000 | Honma ........................ | 369/59.13 |
| 6,683,922 B1 * | 1/2004 | Hayami et al. ................ | 375/341 |
| 2005/0063276 A1 * | 3/2005 | Ogura ......................... | 369/59.22 |
| 2007/0168843 A1 * | 7/2007 | Kanaoka et al. ............... | 714/792 |

FOREIGN PATENT DOCUMENTS

| | | |
|---|---|---|
| JP | 08-195037 | 7/1996 |
| JP | 10-283636 | 10/1998 |
| JP | 2000-285612 | 10/2000 |
| JP | 2002-298518 | 10/2002 |
| JP | 2005-093033 | 4/2005 |
| JP | 2005-190628 | 7/2005 |
| JP | 2007-164923 | 6/2007 |
| WO | WO 2005/024822 A1 | 3/2005 |

OTHER PUBLICATIONS

Kayanuma, Kinji et al., "Eight to Twelve Modulation Code for High Density Optical Disk", International Symposium on Optical Memory 2003, Technical Digest (Nov. 3, 2003), pp. 160-161.

Ogawa, Masatsugu et al., "Development of HD DVD drive technology (Recording Technology)", ITE Technical Report (Jul. 2004) MMS2004-38, CE2004-39, vol. 28, No. 43, pp. 17-20.

Saito, Shuzo et al., "Fundamentals of Modern Information Communications", Ohm-sha, (Dec. 20, 1992), pp. 212-217.

* cited by examiner

*Primary Examiner* — Christopher R Lamb
(74) *Attorney, Agent, or Firm* — Scully, Scott, Murphy & Presser PC (57) ABSTRACT

A Viterbi detector includes an ACS circuit that performs addition of a path metric and branch metrics, comparison of the path metric values and path selection based on the result of comparison. The ACS circuit performs a path decision based on the path metric values and the reproduced signal supplied to the Viterbi detector at the time instant that is a specified number of channel clocks earlier during the path selection. The ACS circuit selects a mark-continuing path if the reproduced signal at the time instant that is the specified number of channel clocks earlier has an amplitude corresponding to any mark, and performs path decision based on the path metric values if the reproduced signal does not have the amplitude corresponding to any mark.

3 Claims, 11 Drawing Sheets

RELATED ART

FIG. 9

RELATED ART

FIG. 10

PATH MERGE        RELATED ART

FIG. 11

RELATED ART

FIG. 13

RELATED ART

VITERBI DETECTOR AND INFORMATION REPRODUCING APPARATUS

TECHNICAL FIELD

The present invention relates to a Viterbi detector and an information reproducing apparatus, and more particularly, to a Viterbi detector that identifies recorded data in a reproduced signal from an information recording medium and an information reproducing apparatus that includes such a Viterbi detector.

BACKGROUND ART

With the increasing use of multimedia in recent years, there has been a need to process large volumes of information including video information. Storage devices of increased capacity are also needed for recording such information. In the field of storages for high quality video information in particular, a capacity exceeding that of the current DVDs (Digital Versatile Disks) is desired of the storage devices. Increasing of the capacity of optical disk apparatuses or HDD units necessitates raising of the recording density. With the recording density improved, it has become an important challenge to reduce an error rate and ensure the reliability. Approaches that have been made toward such an important challenge in terms of optical disks are broadly classified into three types: medium composition approaches, optical approaches, and signal processing approaches. The following description will deal primarily with the signal processing approaches.

In the optical disk, the disk medium is irradiated with a laser beam that is focused by an optical element, and information is detected from the brightness level or polarization of the reflected light. The focused beam spot is finite, and a smaller diameter of the beam spot allows performing of recording and reproducing with a higher density. Optical approaches have thus been employed to reduce the beam spot. The spot diameter is inversely proportional to the NA (Numerical Aperture) of the objective lens and is proportional to the wavelength $\lambda$ of the laser beam. The spot diameter can thus be made smaller by increasing the NA and decreasing the $\lambda$.

A higher NA, however, leads to a shallower depth of focus, whereby the distance between the disk surface and the lens needs to be narrowed. There is thus a limit in the size of NA. The laser wavelength has been on the decrease from an infrared laser ($\lambda$=780 nm) for CD, via a red laser ($\lambda$=650 nm) for DVD to a blue laser ($\lambda$=405 nm) for next-generation DVD. Short-wavelength lasers, however, have such challenges as to achieve stability during high output-power lasing and a longer life. There is thus a limit in reducing the wavelength.

An MTF (Modulation Transfer Function), which is the frequency characteristic of the transfer channel between the optical head and the disk medium, appears as an LPF (Low-Pass Filter) which drops in gain at high frequencies, due to a finite beam spot thereof. Rectangular waves, if recorded, will thus be reproduced with obtuse waveforms. Besides, at an increased recording density, a waveform to be read at a specific time instant can interfere with those of other time instants to cause intersymbol interference. The intersymbol interference makes it difficult to reproduce shorter recorded marks of a specific length or less. If recorded marks are longer, on the other hand, a lower frequency of the output of phase information for extracting a synchronizing clock may cause a loss of synchronization. The mark length therefore needs to be limited to a certain length or less. From the foregoing reasons, data to be recorded on an optical disk is coded for a signal processing approach. The coding often uses RLL code (Run Length Limited code) which limits the distance of code inversion. Examples include ETM (Eight to Twelve Modulation), EFM (Eight to Fourteen Modulation), (1,7) RLL, and 8/16 code. Of these, the EFM modulation code which is used in CD and the 8/16 modulation code which is employed for DVD have a minimum run length of 2 (d=2). The (1,7) RLL and ETM modulation code have a minimum run length of 1. As described in Non-Patent Literature-1, ETM is (1,10) RLL code with a coding rate of 2/3 which is the same as that of (1,7) RLL. ETM is characterized by the limitation on the number of consecutive shortest marks and the performance for compressing DC (Direct Current) components.

There is a technology referred to as waveform equalization. The waveform equalization is to insert an inverse filter for eliminating intersymbol interference, thereby lowering the error rate. The equalization suppresses intersymbol interference by enhancing the high-frequency band components of the reproduced signal, whereas it also enhances the high-frequency band components of noise and sometimes degrades the SNR (Signal to Nose Ratio) of the reproduced signal. The SNR degradation caused by the waveform equalization is a primary factor of errors in detected data at an increased recording density in particular. PR (Partial Response) equalization is a technique of waveform equalization such as causes known intersymbol interference on purpose. The PR equalization does not enhance high-frequency components and can thus suppress SNR degradation.

Among effective techniques of detection is a maximum likelihood detection technique. The technique is to select a time series pattern, from among all possible time series patterns, that provides a minimum mean square of errors with respect to a data string that is known to make certain state transitions, thereby improving the detection performance. It is difficult to perform the foregoing processing on an actual circuit, however, in terms of circuit scale and operating speed. Maximum likelihood detection is thus usually performed by performing path selections asymptotically, using an algorithm referred to as Viterbi algorithm. The information detection using the maximum likelihood detection is referred to as Viterbi decoding or Viterbi detection.

A detection technique that combines the foregoing PR equalization with the Viterbi detection is referred to as a PRML (Partial Response Maximum Likelihood) technique, which can perform data detection with a kind of error correction. The reproduced signal is subjected to a correlation in the direction of time by the PR equalization. A data series that is obtained by sampling the reproduced signal therefore represents certain state transitions alone. Errors in the detected data can be reduced by comparing such limited state transitions with the data series of the actual reproduced data including noise and selecting most likely state transitions. A PRML detection technique using ETM code and a PR(1,2,2,2,1) channel is described in Non-Patent Literature-2. The technique can provide a wide detection margin during high-density recording and reproducing.

To improve the detection performance by Viterbi detection, the frequency characteristics of the reproduction channel need to coincide with certain PR equalization characteristics. PR equalization characteristics as close to those of the reproduction channel as possible are thus selected. Here, a waveform equalizer is typically used to correct the frequency characteristics of the reproduction channel so that the frequency characteristics coincide with specified PR characteristics. An automated equalization or adaptive equalization technique is a technology to adaptively correct the time degradation of the signal for improved detection performance Non-Patent Literature-3 describes adaptive equalization algorithms of sequential type. The Zero Forcing algorithm, the Mean Square algorithm, and the like are commonly used in particular. The adaptive equalization technology is highly effective because it eliminates the need for an initial adjustment to the apparatus.

Figure 8:
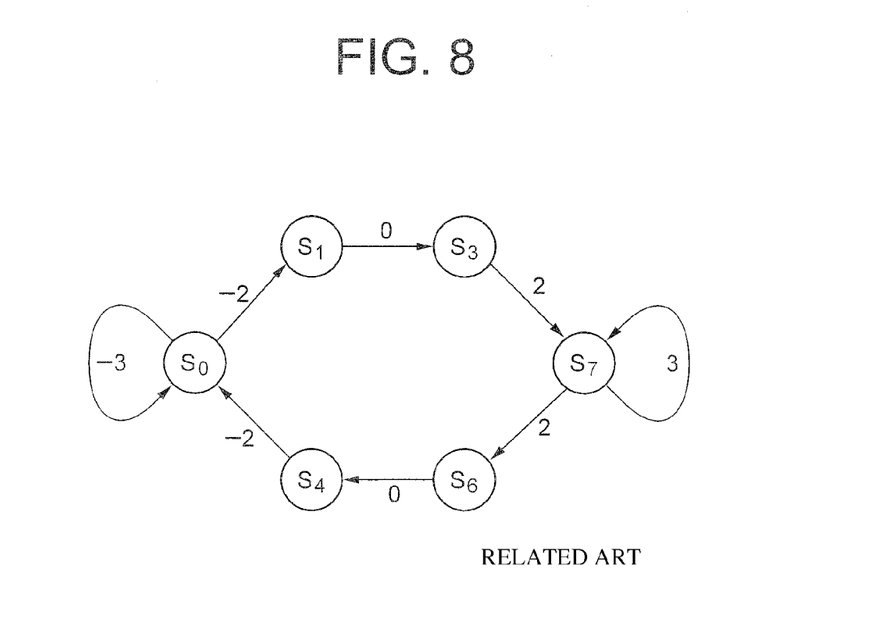
FIG. 8 is a state transition diagram of the PR(1221) channel of recording code with a limit of d=2.

Description will now be given of operation of the Viterbi detection. FIG. 8 illustrates the state transitions of a signal $x_n$ that is a DVD-reproduced signal which is sampled in synchrony with the channel clock, followed by PR(1,2,2,1) equalization. The numerals that accompany the branches extending from the six states represent ideal sample values. For example, in an area where a 4T space (T is the clock cycle) and a 4T mark occur in succession, the state changes such as $S_0 \to S_1 \to S_3 \to S_7 \to S_7 \to S_6 \to S_4 \to S_0 \to S_0 \to S_1 \to \ldots$ as illustrated in FIG. 8. Ideally, xn assumes $-3, -2, 0, 2, 3, 2, 0, -2, -3, -2, \ldots$. In fact, however, the $x_n$ assumes the values of, e.g., $-2.9, -1.9, 0.1, 1.7, 2.9, 0.2, -1.6, -2.9, -2.1, \ldots$ due to noise and other factors. The recording code employed for DVD is limited to a minimum run length of 2, and such paths as $S_3 \to S_6$ and $S_4 \to S_1$ do not exist.

Now, it is assumed that Gaussian noise is superposed on $x_n$, and, $r_n$ assumes any of five reference levels $\{\pm 3, \pm 2, 0\}$. Here, the maximum likelihood detection is to find out $r_n$ that minimizes $\Sigma(x_n - r_n)^2$. Since it is difficult to compare all the combinations in real time, however, the Viterbi algorithm performs the $r_n$ calculations in succession.

Figure 9:
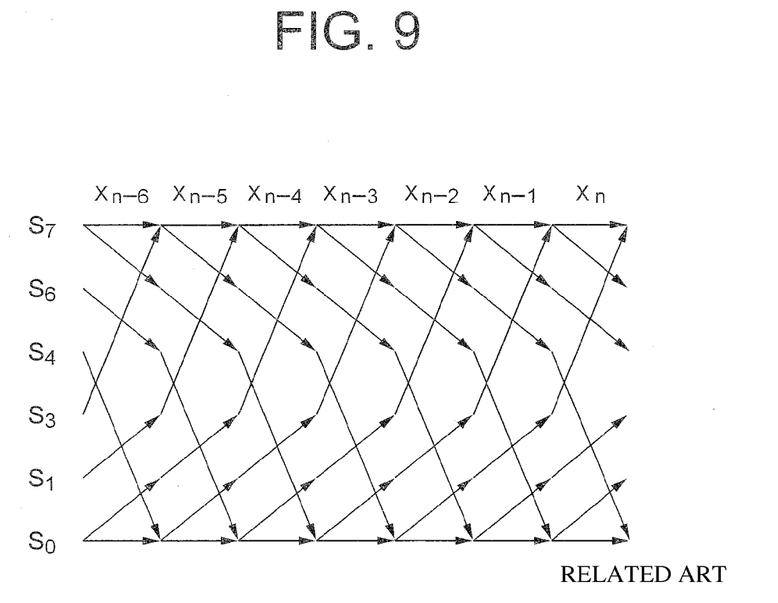
FIG. 9 is a trellis diagram in which the state transition diagram illustrated in FIG. 8 is developed on the time axis.
Figure 10:
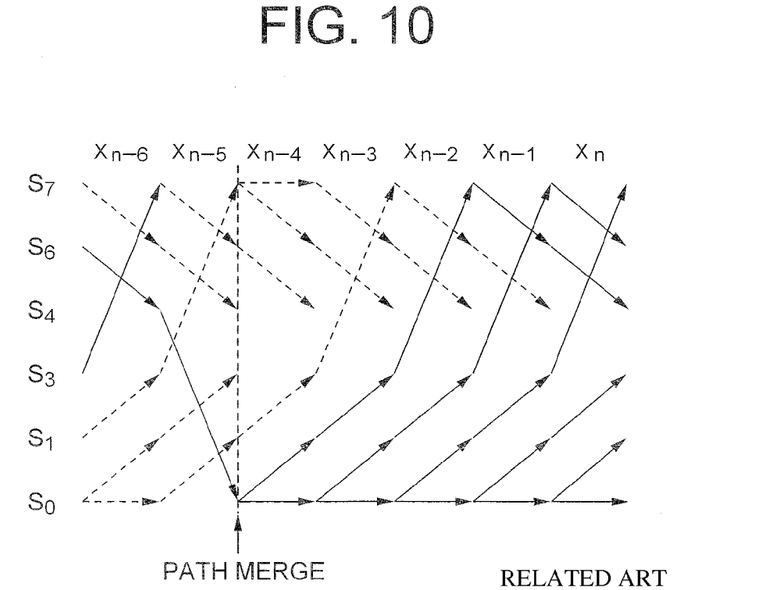
FIG. 10 is a diagram illustrating an example of path merge in the PR(1221) Viterbi detection of recording code with a limit of d=2.

FIG. 9 is a diagram illustrating the state transitions of FIG. 8 developed on the time axis, which is referred to as a trellis diagram. Referring to the diagram, it can be seen that the value of $x_n$ is constrained by previous and following values. PRML uses the constraint condition to improve the accuracy of identification. In FIG. 9, there are points where a plurality of paths are input, such as the states $S_0$ and $S_7$. If a certain condition is applied to the state transitions of FIG. 9 to select a single path from a plurality of paths that make the same state transitions, then the trellis diagram shown by a solid line in FIG. 10 is obtained. The broken lines represent a plurality of paths that are not selected. From the trellis diagram of FIG. 10, it is represented that the paths can be traced back from the respective states at time instant "n" to the past to reach a path merge where the paths converge into one. The information before the merged time instant is settled by the path merge thus obtained.

To select a single path from among a plurality of paths, there is introduced an index of probability referred to as metric. The probability $Pa_n$ for a state Sa to be assumed at time instant n will be referred to as path metric. The square of a difference between $x_n$ and a reference level r will be defined as branch metric $b_n(r)$. The branch metric is expressed by the following equation-1:

$$b_n(r) = (x_n - r)^2; \quad (1)$$

The reference level r is determined from the input signal xn of that time.

The path metric is a summation of branch metrics from the past, and indicates a higher probability if its value is smaller. Referring to FIG. 8, the state one clock (1T time) before the state $S_1$ is always the state $S_0$. A path metric $P1_n$ is thus given by adding the branch metric $b_n(-2)$ at the current time to the path metric $P0_{n-1}$ of the state $S_0$ that is one clock earlier. Thus, $$P1_n = P0_{n-1} + b_n(-2). \quad (2)$$

Likewise, $P3_n$, $P4_n$, and $P6_n$ are given by the following formulas:

$$P3_n = P1_{n-1} + b_n(0); \quad (3)$$

$$P4_n = P6_{n-1} + b_n(0); \quad (4) \text{ and}$$

$$P6_n = P7_{n-1} + b_n(2). \quad (5)$$

$P0_n$ is calculated by the following way. The state one clock before the state $S_0$ is $S_0$ or $S_4$. The state S0 has two paths. Here, the path metrics of the two paths are compared to select a path of smaller value. Assuming that Min[a,b] is a function to select the smaller value between "a" and "b":

$$P0_n = \text{Min}[P0_{n-1} + b_n(-3), P4_{n-1} + b_n(-2)]. \quad (6)$$

Likewise, $P7_n$ is defined by the following equation-7:

$$P7_n = \text{Min}[P7_{n-1} + b_n(3), P3_{n-1} + b_n(2)]. \quad (7)$$

The path metrics are updated and path selections are made at each time, whereby each state has a single path input. Such paths are sequentially traced back to the past, and beyond a certain time the paths merge to settle the information. Note that equations-6 and -7 have only to be capable of comparing the path metrics in magnitude. Since the term xn2 in bn(r) is common between all the path metrics, the branch metrics may be given by the following equation, in which case there is an advantage that the circuit can be simplified:

$$b_n(r)' = r^2 - 2rx_n.$$

Figure 11:
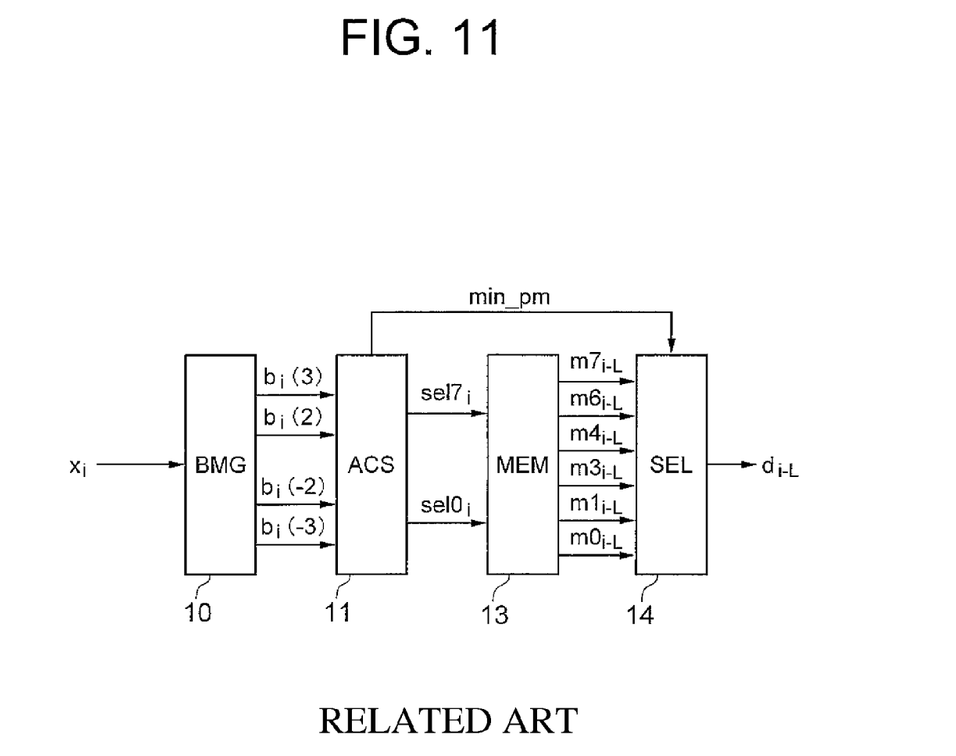
FIG. 11 is a block diagram illustrating the configuration of a typical Viterbi detector.

The foregoing processing is usually performed in units of the channel clock, and a high speed processing is thus needed. For example, an 8×-speed DVD has a channel clock frequency of over 200 MHz, and the foregoing processing is thus typically performed by a dedicated circuit. FIG. 11 illustrates the configuration of a Viterbi detector. A path-metric calculation circuit 11 has the functions of adding a path metric and a branch metric, comparing path metric values, and selecting a path based on the result of comparison. Using the initials of the functions, the path-metric calculation circuit 11 is referred to as ACS circuit. The Viterbi detector includes at least the ACS circuit 11, a branch-metric generation circuit (BMG circuit) 10 which is intended to calculate branch metrics, and a memory (MEM) 13 which is intended to store path-select information and is referred to as path memory. In Viterbi detection, paths can be merged if the memory length is long. With a memory of finite length, some input signals may fail to be merged. In view of this possibility, the Viterbi detector in FIG. 11 includes a maximum-likelihood-path selection circuit (SEL) 14 that searches for a path having the minimum value among a plurality of path metric values and outputs the information thereof.

In the PRML detection, it is known that even a signal that has too low SNR to be detected by level detection at all can be detected by using a Viterbi detector so long as the signal level distribution after adaptive equalization is close to a normal distribution with respect to each reference level. This condition mostly corresponds to such cases as when recorded marks have superior quality and yet high jitter or high intersymbol interference, when a disk tilt occurs, and when reproduction is performed in a defocused state.

Figure 12:
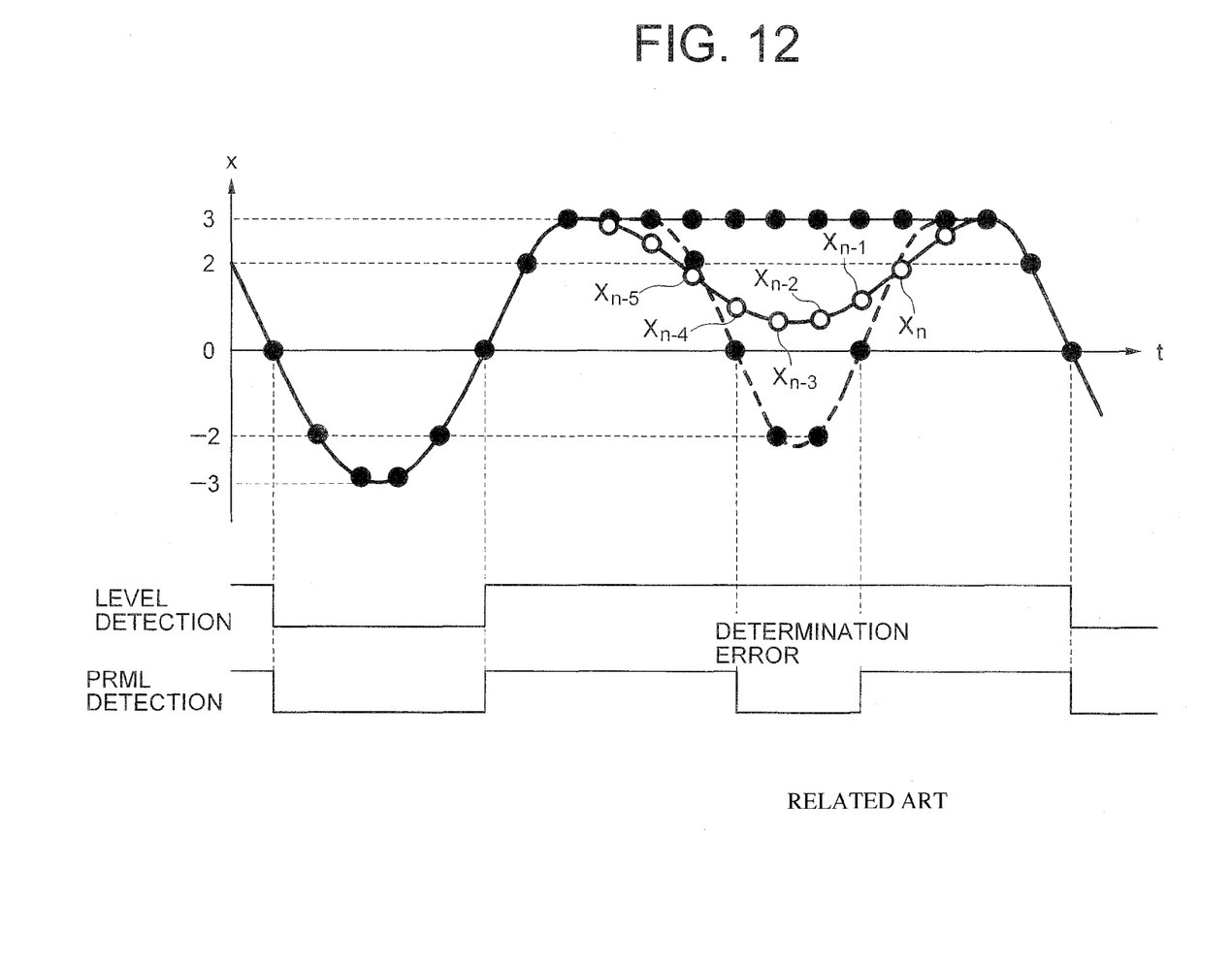
FIG. 12 is a waveform chart illustrating a reproduced signal waveform, the result of level detection, and the result of PRML detection.

The PRML detection system can sometimes fall behind the conventional level detection system in performance, however, if marks are recorded on the disk in imperfect shapes mainly because of the control of recording power. FIG. 12 illustrates the reproduced waveform of a long mark (14T) with waveform distortion. The waveform corresponds to the reproduced waveform of a mark that is formed by a recording strategy such that the recording power decreases in the center of the long mark. With the level detection system, it is possible to detect the 14T from the foregoing waveform without a problem. The Viterbi detector, however, sometimes selects the path that is represented by the dotted line in the chart because of the decrease in amplitude. Here, the Viterbi detector can make an erroneous decision that the 14T mark is a 6T mark+a 3T space+a 5T mark, considering the low amplitude portion in the center of the long mark as the 3T space.

The Viterbi detection uses path metrics to determine the likelihood of the continuous waveform pattern as described above. Assuming that each sample point (solid circle) in FIG. 12 is $x_i$ and a string of ideal values of possible data path is $r_i$, a path metric $P_n$ at time instant n can be expressed by the following equation:

$$P_n = \Sigma_{i=1,n} (x_i - r_i)^2 \qquad (8)$$

Taking a span of six times, a path metric $P_n'$ with the long mark as ideal values and a path metric $P_n''$ with the 3T space as ideal values are expressed by the following respective equations:

$$P_n' = (x_n-3)^2 + (x_{n-1}-3)^2 + (x_{n-2}-3)^2 + (x_{n-3}-3)^2 + (x_{n-4}-3)^2 + (x_{n-5}-3)^2; \qquad (9) \text{ and}$$

$$P_n'' = (x_n-2)2 + (x_{n-1}-0)2 + (x_{n-2}+2)^2 + (x_{n-3}+2)^2 + (x_{n-4}-0)^2 + (x_{n-5}-2)^2. \qquad (10)$$

If $P_n' < P_n''$, there is determined to be a long mark. If the input waveform is distorted, for example, like $(x_{n-5}, x_{n-4}, x_{n-3}, x_{n-2}, x_{n-1}, x_n) = (1.8, 1.0, 0.5, 0.5, 1.0, 1.9)$, however, $P_a' = 23.15$ and $P_n'' = 14.55$. That is, $P_n' > P_n''$. In this case, the long-mark path is not selected and there occurs an erroneous decision that there are a 6T mark+a 3T space+a 5T mark.

The level detection is a conventionally-used technique and has been employed for many optical disk drives. Reproduction compatibility with disks that are recorded by the conventional drives is indispensable even for optical disk drives that incorporate the Viterbi detection that has come into use recently. Although the PRML-based detection can be expected to improve the reproducing performance, there is the problem that the PRML detection may fall behind the threshold detection in performance when detecting a reproduced signal of high nonlinearity, such as when the recorded marks are imperfect.

Figure 13:
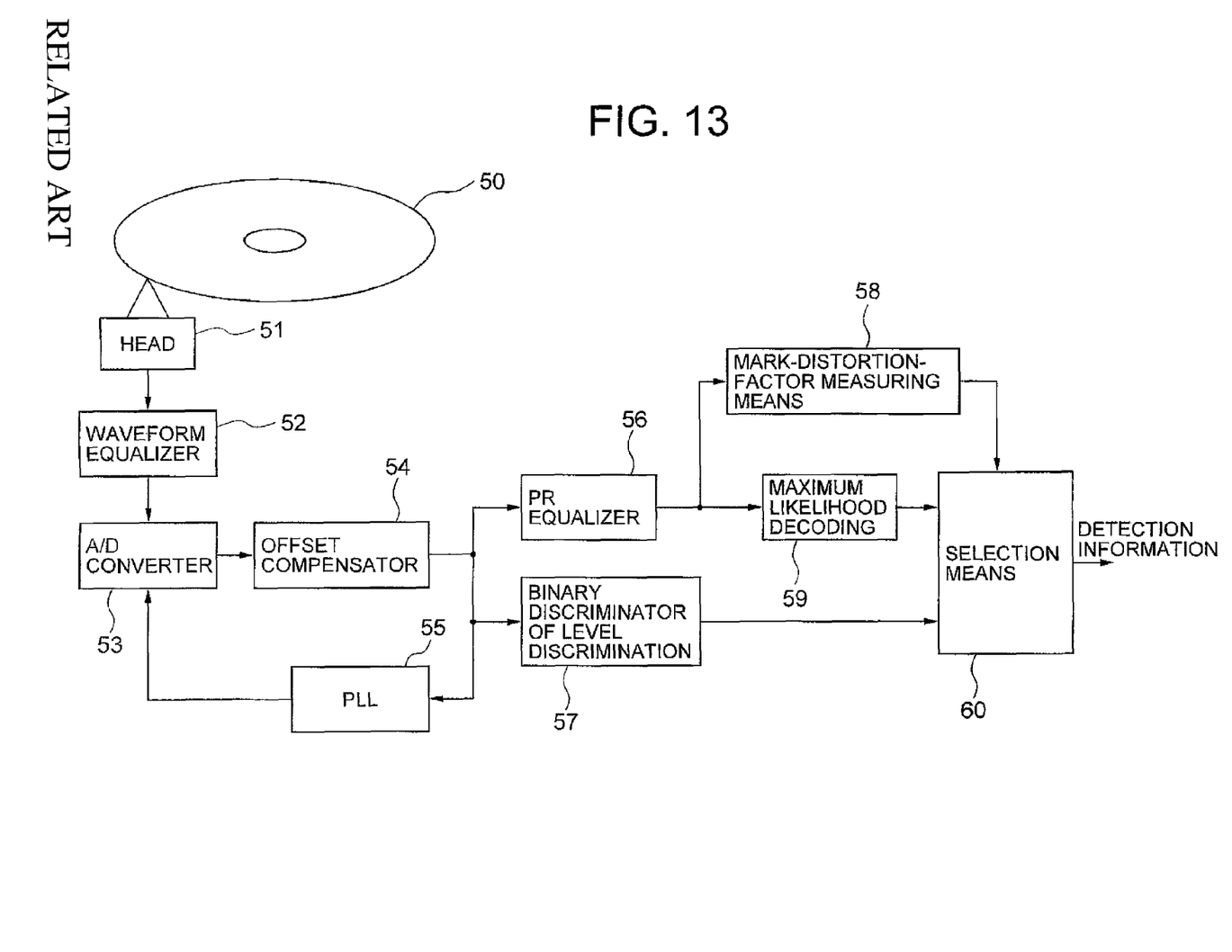
FIG. 13 is a block diagram illustrating the configuration of an information recording/reproducing apparatus according to the related art.

Patent Publication-1 describes a technology for avoiding the foregoing problem. FIG. 13 illustrates the configuration of the apparatus described in Patent Publication-1. According to the technology, recorded data on an optical disk medium 50 is converted into an electric signal through an optical head 51 and corrected in frequency characteristics by a waveform equalizer 52 before being sampled by an A/D converter 53. The sampling clock here is the channel clock that a PLL 55 generates from the signal for which the range of DC variation at low frequencies is suppressed by an offset compensator 54. The output of the offset compensator 54 is input to a PRML detection system which includes a PR equalizer 56 and a maximum likelihood decoder 59, and to a binary discriminator 57 of a level discrimination system. The results of the two types of detection are input to a selection means 60, and either one of them is output. A mark-distortion-factor measurement means 58 calculates the waveform distortion factor of the output of the PR equalizer 56. Based on the distortion factor, the selection means 60 outputs the result of level detection if the distortion is higher. If the distortion ratio is lower, on the other hand, the selection means 60 outputs the result of PRML detection. This makes it possible to obtain a reproducing quality that is hardly influenced by mark distortions.
Patent Publication-1: JP-2005-93033A Non-Patent Literature-1: Kinji Kayanuma, et al., "Eight to Twelve Modulation Code for High Density Optical Disk," International Symposium on Optical Memory 2003, Technical Digest pp. 160-161, Nov. 3, 2003
Non-Patent Literature-2: Ogawa, Honma, et al., "Development of HD DVD drive technology (Recording technology)," ITE TECHNICAL REPORT VOL. 28, NO. 43, PP. 17-20, MMS2004-38, CE2004-39 (JULY 2004)
Non-Patent Literature-3: Shuzo Saito, et al., "Fundamentals of Modern Information Communications," Ohm-sha, Dec. 20, 1992, pp. 212-217

The technique described in Patent Publication-1 includes switching to threshold detection if the mark distortion factor is higher. The detection performance higher than that of the level detection is therefore not available in spite of the implementation of PRML. The technique also involves the two detection systems and the special circuit for determining the distortion factor, with a result of an increase in the circuit scale and power consumption.

SUMMARY OF THE INVENTION

It is an object of the present invention to solve the problems of the foregoing conventional technologies, and to provide a Viterbi detector, a Viterbi detection method, and an information reproducing apparatus which can perform superior reproduction with a simple configuration even in the presence of mark distortion.

The present invention provides a Viterbi detector for identifying recorded data in a reproduced signal from an information recording medium, including: a branch-metric calculation unit that calculates branch metric values corresponding to the reproduced signal and a plurality of possible paths; a path metric calculator that includes an adder that adds a path metric value currently retained and the branch metric values corresponding to reproduced signals of a plurality of possible paths, a comparator that compares results of addition by the adder corresponding to the plurality of possible paths with one other, a selection circuit that refers to a result of comparison by the comparator and selects one of the plurality of possible paths, and an update unit that updates the retained path metric value by the result of addition corresponding to the path selected by the selection circuit; and a decision circuit that makes a path decision based on the path metric value currently retained by the path metric calculator and the reproduced signal at a time instant that is a specified number of channel clocks earlier, wherein: the selection circuit selects a path based on the result of comparison by the comparison circuit and the result of decision by the decision circuit.

The present invention also provides a Viterbi detection method for identifying recorded data in a reproduced signal from an information recording medium, wherein one of a plurality of paths is selected based on a path metric value calculated from the reproduced signal and the reproduced signal at a time instant that is a specified number of channel clocks earlier.

The present invention further provides an information reproducing apparatus including: a signal reproduction unit that generates a reproduced signal from an information recording medium; a branch-metric calculation unit that calculates branch metric values corresponding to the reproduced signal and a plurality of possible paths; a path metric calculator that includes an adder that adds a path metric value currently retained and the branch metric values corresponding to reproduced signals of a plurality of possible paths, a comparator that compares results of addition by the adder corresponding to the plurality of possible paths with one another, a selection circuit that refers to a result of comparison by the comparator and selects one of the plurality of possible paths, and an update unit that updates the retained path metric value by the result of addition corresponding to the path selected by the selection circuit; and a decision circuit that makes a path decision based on the path metric value currently retained by the path metric calculator and the reproduced signal at a time instant that is a specified number of channel clocks earlier, wherein: the selection circuit selects a path based on the result of comparison by the comparison circuit and the result of decision by the decision circuit.

The Viterbi detector, the Viterbi detection method, and the information reproducing apparatus according to the present invention are capable of performing superior information reproduction even in the presence of mark distortion. Since neither a detector other than the Viterbi detector nor a distortion-factor determination circuit of complicated configuration is involved, it is possible to simplify the configuration of the Viterbi detector.

The above and other objects, features and advantages of the present invention will be more apparent from the following description, referring to the accompanying drawings.

EMBODIMENTS OF THE INVENTION

Figure 1:
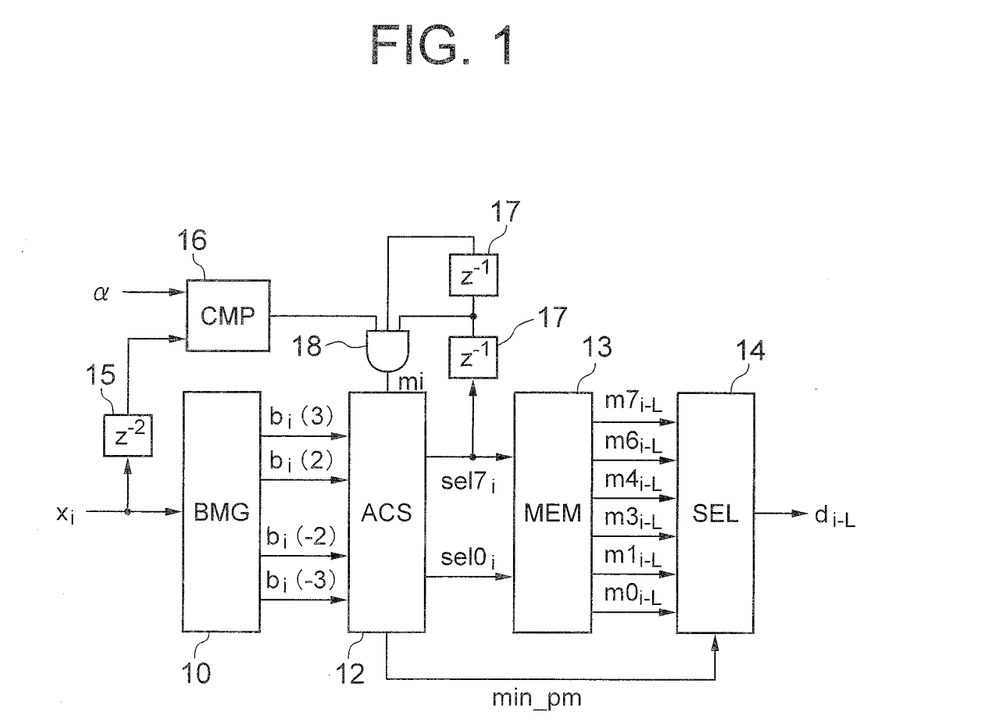
FIG. 1 is a block diagram illustrating the configuration of a Viterbi detector according to a first embodiment of the present invention.

Hereinafter, exemplary embodiments of the present invention will be described with reference to the drawings. FIG. 1 illustrates a Viterbi detector according to a first embodiment of the present invention. The Viterbi detector includes a branch-metric generation circuit (BMG) 10, an ACS circuit 12, a path memory (MEM) 13, a maximum-likelihood-path selection circuit (SEL) 14, a 2T delay circuit ($Z^{-2}$) 15, a comparison circuit (CMP) 16, delay units ($Z^{-1}$) 17, and an AND circuit 18. Here, Viterbi detection corresponding to a PR(1,2,2,1) channel with a limit of d=2 will be discussed. The state transition diagram is the same as illustrated in FIG. 8.

The branch-metric generation circuit 10 generates branch metric values for respective paths with respect to an input $x_i$. For PR(1,2,2,1) with a limit of d=2, branch metrics need to be generated for a total of five reference levels r=0, ±2, and ±3. If $b_n(r)'=r^2-2rx_n$ is used to calculate the branch metrics, however, the branch-metric generation circuit 10 has only to output four $b_i(r)$, excluding r=0, since the branch metric for r=0 is zero. That is, the branch-metric generation circuit 10 outputs four branch metrics $b_i(3)$, $b_i(2)$, $b_i(-2)$, and $b_i(-3)$.

Receiving the branch metrics $b_i(r)$ output from the branch-metric generation circuit 10, the ACS circuit 12 generates and selects path metrics. The path metrics are generated according to equations-2 to -7. For $P7_i$, the output $m_i$ of the AND circuit 18 is added as a condition for path selection. More specifically, if the output mi of the AND circuit 18 is false ("0"), the ACS circuit 12 selects a smaller one between $P7_{n-1}+b_n(3)$ and $P3_{n-1}+b_n(2)$ according to equation-7. If $m_i$ is true ("1"), the ACS circuit 12 selects $P7_{i-1}+b_i(3)$ regardless of the values of the path metrics.

Referring to the state transition diagram illustrated in FIG. 8, path selection is needed of two states among the six states, or $S_7$ and $S_0$. The ACS circuit 12 outputs the two types of select information as $sel7_i$ and $sel0_i$, respectively. If $P7_{n-1}+b_n(3)$ is selected for $P7_n$ in the path selection, the ACS circuit 12 outputs path-select information $sel7_i=1$ (true). If $P3_{n-1}+b_n(2)$ is selected, the ACS circuit 12 outputs path-select information $sel7_i=0$ (false). If $P0_{n-1}+b_n(-3)$ is selected for $P0_n$, the ACS circuit 12 outputs path-select information $sel0_i=1$ (true). If [[P4n-1+bn(-2)]] $P4_{n-1}+b_n(-2)$ is selected, the ACS circuit 12 outputs path-select information $sel0_i=0$ (false).

Receiving the path-select information $sel7_i$ and $sel0_i$, the path memory 13 updates its internal states, and outputs Viterbi outputs (binary outputs) $mx_{(i-L)}$ for situations where a state Sx is assumed at a time instant that is L clocks before the latest time instant i. Specifically, the internal states are updated as follows:

$$m7_{(j-1)}=m7_j \text{ if } sel7_i=1,$$

$$m7_{(j-1)}=m3_j \text{ if } sel7_i=0,$$

$$m6_{(j-1)}=m7_j,$$

$$m4_{(j-1)}=m6_j,$$

$$m3_{(j-1)}=m1_j,$$

$$m1_{(j-1)}=m0_j,$$

$$m0_{(j-1)}=m0_j \text{ if } sel0_i=1,$$

$$m0_{(j-1)}=m4_j \text{ if } sel0_i=0, \text{ and}$$

$$\{m7_i,m6_i,m4_i,m3_i,m1_i,m0_i\}=\{1,1,1,0,0,0\}$$

The ACS circuit 12 outputs a path metric code that provides the minimum path among the path metrics corresponding to the six states as min_pm. The maximum-likelihood-path selection circuit 14 selects the output of the path memory that is in the state corresponding to min_pm from among the Viterbi outputs of the path memory 13 corresponding to the six states, and outputs the selected output as a pattern $d_{(i-L)}$. If L is increased, the paths usually merge and $mx_{(i-L)}$ come into an identical value irrespective of whether the state x is, 0, 1, 3, 4, 6, or 7. In some cases, the paths might not merge and $mx_{(i-L)}$ may have different values, however. The maximum-likelihood-path selection circuit 14 delivers the output of the path memory that corresponds to the minimum-path state as the pattern $d_{(i-L)}$, whereby the most likely pattern can be output even if the paths do not merge.

The input value $x_i$ of the Viterbi detector is delayed by the 2T delay circuit 15 by a period corresponding to 2T, and input to the comparison circuit 16. The comparison circuit 16 decides whether or not the input value $x_i$ has an amplitude corresponding to any mark. More specifically, the comparison circuit 16 compares the input value $x_i$ with a specified threshold value $\alpha$, and outputs the result of comparison. For example, if xi>$\alpha$, the comparison circuit 16 decides that the amplitude corresponds to any mark, and outputs the result of comparison=1 (true). If not, the comparison circuit 16 outputs the result of comparison=0 (false). Note that FIG. 1 illustrates the configuration that the input $x_i$ is delayed by the 2T delay circuit 15 before input to the comparison circuit 16. It is possible, however, to input the input value $x_i$ to the comparison circuit 16 without the intervention of any delay unit, and delay the result of comparison from the comparison circuit 16 by two clocks by a 2T delay circuit.

The result of comparison from the comparison circuit 16 is input to the AND circuit 18 along with the path-select information $sel7_i$ that is output from the ACS circuit 12 and delayed by one clock by the delay unit 17, and the same information that is further delayed by one clock by the delay circuit 17. The AND circuit 18 outputs the logical product $m_i$ of the result of comparison from the comparison circuit 16 and the pieces of path-select information $sel7_i$ that are one clock and two clocks earlier. The $m_i$ is true if there remains a long mark pattern path and the input value that is two clocks earlier is higher than $\alpha$. While FIG. 1 illustrates the case where $\alpha$ is compared with the signal of two clocks earlier, $\alpha$ may be compared with the signal of three clocks earlier. In such a case, the AND circuit 18 is configured as a four-input AND circuit, and $sel7_{(i-3)}$ which is $sel7_{(i-2)}$ further delayed by one clock is input to the AND circuit as well as $sel7_{(i-1)}$ and $sel7_{(i-2)}$. If some deterioration in performance is allowed for a lower SNR, mi may be generated on the condition of $x_{(i-2)}$>$\alpha$ alone, the conditions of $sel7_{(i-1)}$ and $sel7_{(i-2)}$ being omitted.

Figure 2:
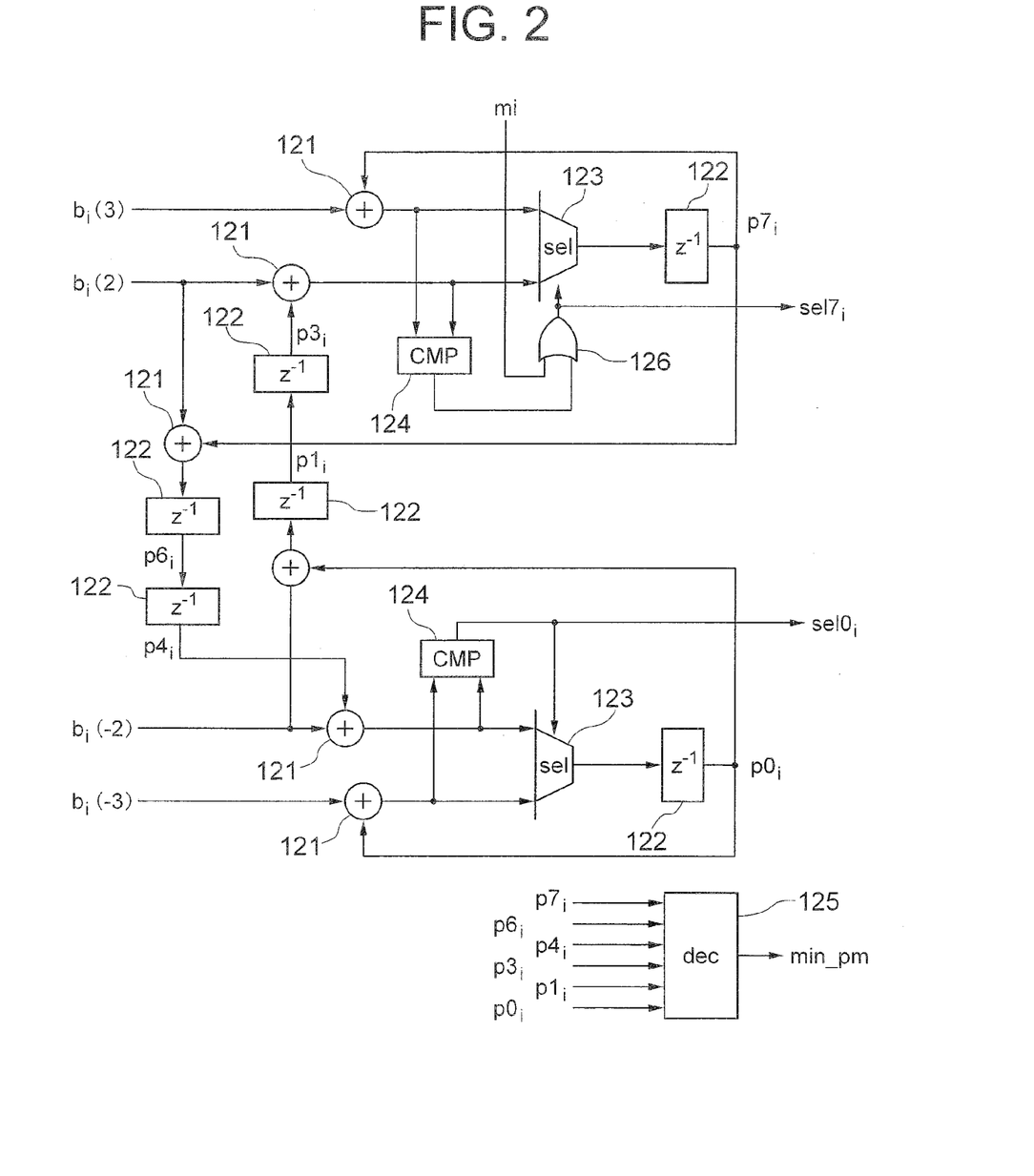
FIG. 2 is a circuit diagram illustrating the configuration of an ACS circuit in the first embodiment.

FIG. 2 illustrates an example of configuration of the ACS circuit 12. The ACS circuit 12 is the circuitry that embodies the recurrence formulas of equations-2 to -7 through the combinations of adders 121, delay units 122 for delaying data by one clock, selection circuits 123, and comparators 124. For $P7_i$, the output mi of the AND circuit 18 provides an additional condition. That is, if $m_i$ is true, $P7_i$=$P7_{i-1}$+$b_i(3)$ is selected irrespective of the result of comparison between $P7_{i-1}$+$b_i(3)$ and $P3_{i-1}$+$b_i(2)$. If $m_i$ is false, $P7_i$=Min[$P7_{i-1}$+$b_i$ (3), $P3_{i-1}$+$b_i(2)$] is selected according to the result of comparison. Such an operation is achieved by the comparator 124 that compares $P7_{i-1}$+$b_i(3)$ with $P3_{i-1}$+$b_i(2)$, an OR circuit 126 that outputs the logical sum of the output of the comparator 124 and the output mi of the AND circuit 18, and the selection circuit 123 that selectively outputs $P7_{i-1}$+$b_i(3)$ and $P3_{i-1}$+$b_i(2)$ based on the output of the OR circuit 126.

More specifically, the comparator 124 outputs "1" (true) if $P7_{i-1}$+$b_i(3)$<$P3_{i-1}$+$b_i(2)$, and outputs "0" (false) if $P7_{i-1}$+$b_i(3)$>$P3_{i-1}$+$b_i(2)$. If mi is false, the output of the OR circuit 126 is either true or false based on the result of comparison by the comparator 124. Based on the result of comparison by the comparator 124, i.e., based on the magnitude of the path metrics, the selection circuit 123 makes a path selection by selecting $P7_{i-1}$+$b_i(3)$ if the output of the comparator 124 is true, and selecting $P3_{i-1}$+$b_i(2)$ if the output of the comparator 124 is false. If mi is true, the output of the OR circuit 126 is true regardless of the result of comparison from the comparator 124. The selection circuit 123 then unconditionally selects $P7_{i-1}$+$b_i(3)$, selecting the path returning $S_7 \rightarrow S_7$.

The ACS circuit 12 also includes a decoder 125. The decoder 125 receives the path metric values, and outputs a path metric code that provides the minimum path among the path metrics corresponding to the six states as min_pm.

The foregoing description has dealt with the PR(1,2,2,1) channel. Nevertheless, the configuration for performing a path selection based on the amplitude of the input signal and the path select signal occurring a specific time length earlier is not limited to the PR(1,2,2,1) channel, and may be applied to other PR channels such as PR(1,3,3,1) and PR(1,1). The code is not limited to RLL code with a limit of d=2, either, and may be a code with a limit of d=1 such as ETM code. The threshold value $\alpha$ may be $\alpha$=0. In such a case, the sign bit, i.e., MSB of the input value xi can be used to decide if the input value xi is higher than or equal to the threshold value. This provides the advantage that the comparison circuit 16 of FIG. 1 need not be provided.

Figure 3:
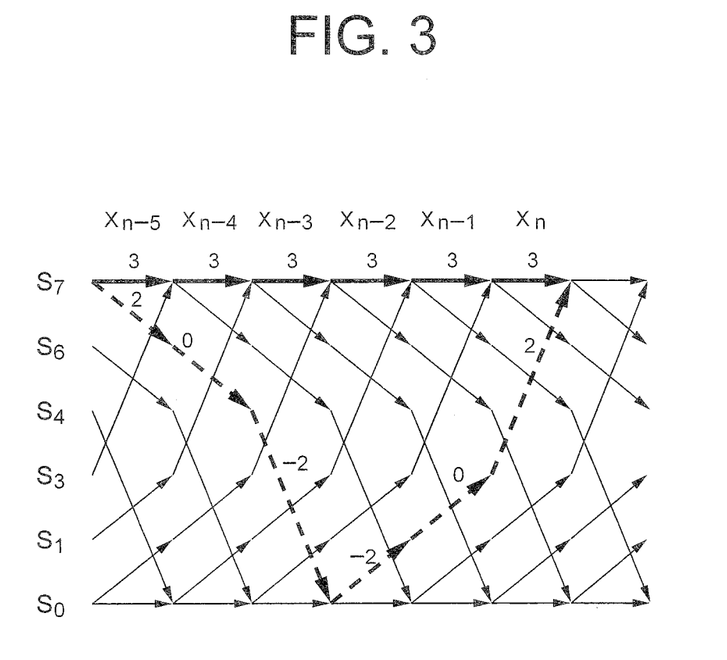
FIG. 3 is a trellis diagram of the PR(1221) channel of recording code with a limit of d=2.

FIG. 3 illustrates a trellis diagram of the PR(1221) channel with a limit of d=2. The path represented by the thick lines in the diagram (path A) is a path where $S_7$ continues on, i.e., where a mark is continuously detected. The path represented by the broken lines (path B) is a path where a state transition of $S_7 \rightarrow S_6 \rightarrow S_4 \rightarrow S_0 \rightarrow S_1 \rightarrow S_3 \rightarrow S_7$ occurs, the path being of the case where there is a 3T space. While path selections are performed at $S_7$ and $S_0$, an erroneous decision ascribable to the distortion of a long mark may occur during the path selection at $S_7$. In order for the state $S_7$ to be assumed at a time instant n, there are two possible situations: where the state transitions have been made through the paths represented by the path A and where the state transmissions have been made through the paths represented by the path B. If the state $S_7$ is reached through the path A, the input values of the Viterbi detector at a time instant that is two clocks earlier, (n−2), and at a time instant that is three clocks earlier, (n−3), are both "3." If the state $S_7$ is reached through the path B, the input values of the Viterbi detector occurring two clocks earlier and three blocks earlier are both "−2."

When a long mark continues, the mark portion in the vicinity of the center may decrease in amplitude due to waveform distortion as illustrated in FIG. 12. If a path selection is made based on the path metrics, the path illustrated by the broken line in FIG. 12, i.e., the path B of FIG. 3 may be selected to result in a detection error. The decrease in amplitude, if any, is such that the mark can be correctly detected by threshold detection, and it is unlikely that the input value x assumes negative at time instant (n−2) while a long mark continues. That is, when a long mark continues and even if the path B is selected by path selection based on the path metric values, it is quite unlikely that the amplitude value at a time instant that is two or three clocks before time instant n represents a drop down to −2.

For this reason, the result of decision as to whether or not the input value $x_{(n-2)}$ or $x_{(n-3)}$ at a time instant that is two or three clocks before time instant n has an amplitude corresponding to any mark is added to the conditions for the path selection at time instant n, aside from the comparison between the path metric values in an ordinary Viterbi detector. The result of decision is output from the comparison circuit 16 in FIG. 1. If the input value two clocks before the path selection at time instant n is positive, the ACS circuit 12 selects the mark-continuing path regardless of the magnitudes of the path metric values. This makes it possible to suppress the occurrence of a detection error. Note that the ideal input values of the paths A and B two clocks earlier are 3 and −2, respectively, with a difference of 5 therebetween. The maximum difference of 5 in the absolute value is available at two clocks earlier and three clocks earlier. The comparison at such times thus minimizes determination errors, although the decision can be made at other time instants.

The foregoing has dealt with the case where the input value x at a time instant that is two or three clocks earlier is added to the conditions for the path selection. Using only the result of decision on the input value x at the time instant two or three clocks earlier, however, can possibly cause a performance deterioration in the case of a lower SNR. A condition that a mark-continuing path has been remaining since two or three clocks earlier is thus added to the conditions for the path selection. In FIG. 1, the path-select information sel1 is subjected to the delay unit 17 that delays the information by one clock and the delay unit 17 that further delays the information by one clock. The condition that a mark-continuing path has been remaining, i.e., the condition that the $S_7 \rightarrow S_7$ path was selected one and two clocks earlier is thereby added to the conditions for path selection. If the input value $x_{(n-2)}$ to the comparison circuit 16 is higher than or equal to the threshold value and a mark-continuing path has been selected by the path selections since the time instant that is two clocks earlier, the ACS circuit 12 selects the mark-continuing path regardless of the magnitudes of the path metric values. This can improve the performance characteristics.

In the present embodiment, the latest path selection is made based on the path metric values and the input value to the Viterbi detector at a time instant that is a specified number of channel clocks earlier. Since the path selection is performed based on the magnitude of input value occurring at a specified number of channel clocks before the current time instant as well as the values of the path metrics, it is possible to select a mark-continuing path, i.e., the original path, by the Viterbi detection and avoid a detection error even if the input value corresponding to the mark decreases in amplitude. Such a Viterbi detector can be used in an information reproducing apparatus so that improved Viterbi detection is performed on a disk that has long marks formed with a narrow center portion according to its recording strategy.

In the present embodiment, detection errors are prevented by performing a path selection based on the input value occurring at a specified number of channel clocks before the current time instant. Such a configuration precludes detection errors even without a detector other than the Viterbi detector, and without a complicated distortion decision device. This makes it possible to fabricate the Viterbi detector with a simple configuration, and to reduce the circuit scale and power consumption as compared to the Viterbi detector of the related art that additionally uses a detector other than the Viterbi detector and includes a complicated distortion decision device. Due to addition of the path-select information occurring since a specified number of channel clocks before the current time instant to the conditions for path selection, the detection performance improves as compared to the case where the path-select information occurring since the specified number of channel clocks earlier is not used.

Figure 4:
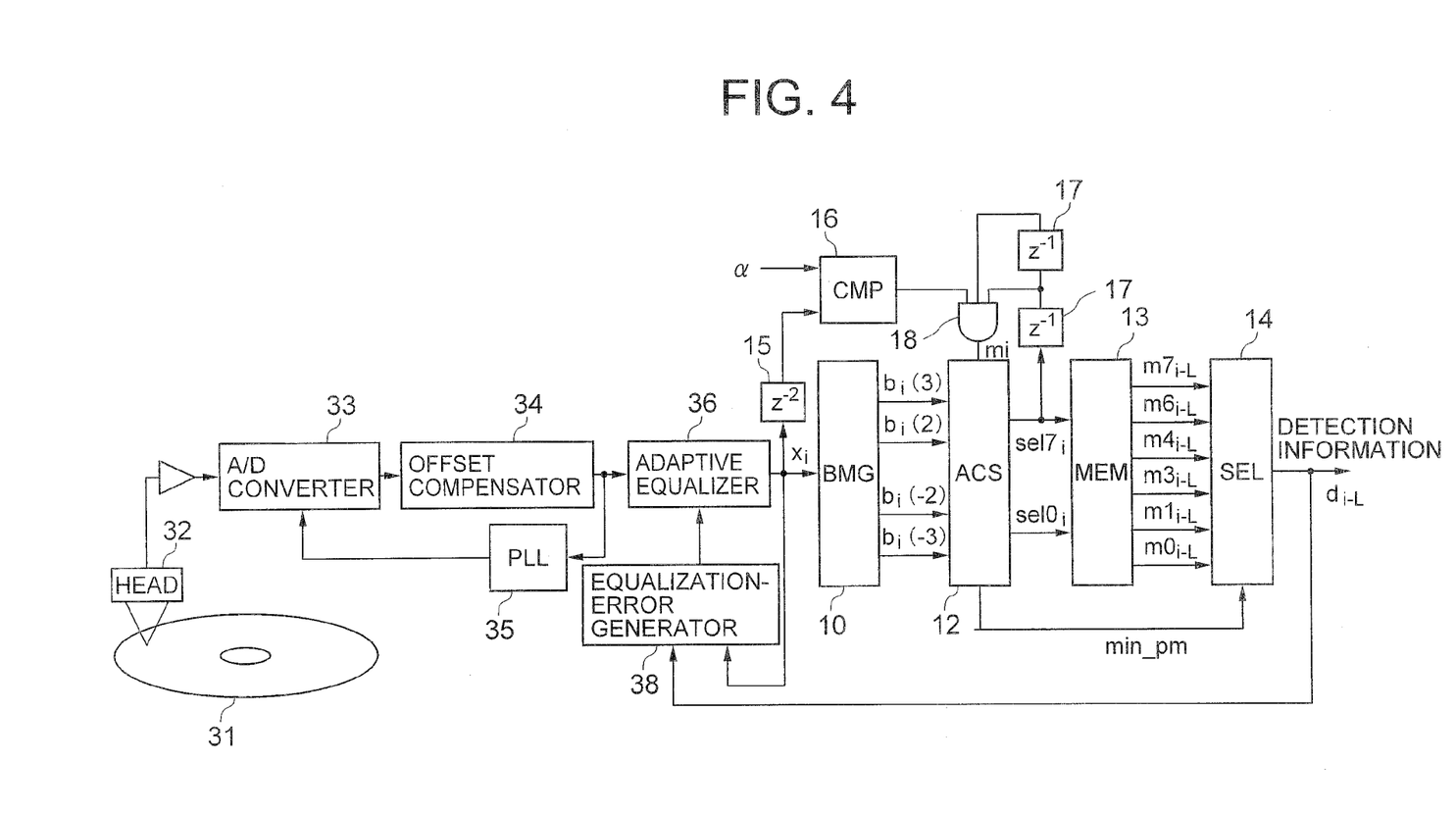
FIG. 4 is a block diagram illustrating the configuration of an information reproducing apparatus that includes the Viterbi detector.

FIG. 4 illustrates the configuration of an optical-disk-information reproducing apparatus that includes the Viterbi detector. A not-illustrated spindle motor rotates an optical disk medium 31 at a constant angular velocity or constant linear velocity. A not-illustrated servo circuit controls the objective lens in an optical head 32, thereby controlling the distance between the disk surface and the objective lens. The servo circuit also controls the position of the optical head 32 in the radial direction of the optical disk medium 31 so that a focused spot emitted from the optical head 32 follows guide grooves. The optical head 32 irradiates information marks recorded on the disk with the focused spot. The reflected light from the disk surface varies in reflectance or polarization depending on the presence or absence of information marks. A not-illustrated detector detects the reflected light from the disk surface, and generates a reproduced signal (reproduced waveform).

The reproduced signal represents the presence or absence of recorded marks as amplitude information. After being passed through a not-illustrated anti-aliasing filter, the reproduced signal is converted into digital information having a width of several bits by an A/D converter 33. The sampling clock of the A/D converter 33 is phase-controlled to assume an input channel frequency by a PLL 35. The reproduced signal digitized by the A/D converter 33 has offsets due to low-frequency fluctuations or asymmetry, which are corrected by an offset compensator 34. The output of the offset compensator 34 is input to an adaptive equalizer 36. The adaptive equalizer 36 performs automated equalization so that the equalizer output provides a desired PR channel. An equalization-error generator 38 generates equalization errors based on the output of the adaptive equalizer 36 and detection information $d_{(i-L)}$ which is the result of binary decision that is made based on the output of the adaptive equalizer 36. The adaptive equalizer 36 exercises control so as to minimize the mean square value of the equalization errors generated by the equalization-error generator 38.

The output of the adaptive equalizer 36 is input to the Viterbi detector. The branch-metric generation circuit 10 generates several types of branch metrics based on the output of the adaptive equalizer 36. The ACS circuit 12 updates path metrics based on the branch metrics generated by the branch-metric generation circuit 10. In updating the path metrics, the ACS circuit 12 outputs path-select information (sel7$_i$, sel0$_i$) to the path memory 13. The Viterbi detector outputs a likely binary detection value (detection information $d_{(i-L)}$) through the path memory 13 and the maximum-likelihood-path selection circuit 14.

For path selection, the ACS circuit 12 unconditionally selects the $S_7 \rightarrow S_7$ path for the path metric P7$_i$ if the output of the comparison circuit 16 is true and the logical product of the path-select information sel7$_{(i-1)}$ occurring one clock earlier and the path-select information sel7$_{(i-2)}$ occurring two clocks earlier is "true," i.e., the input value $x_{(i-2)}$ of the Viterbi detector two clocks earlier is higher than the threshold value α, and there remains a long-mark-continuing path. Such a path selection can be performed to improve the detection performance against long mark distortion.

Figure 5:
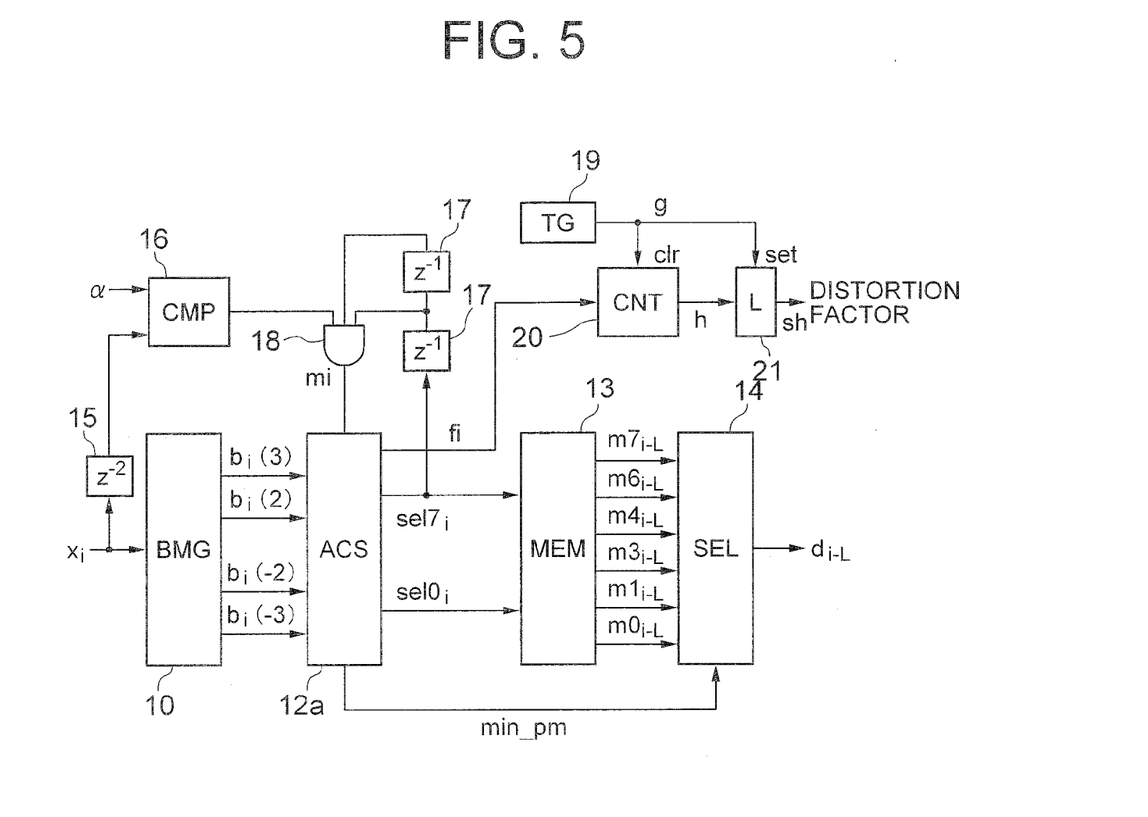
FIG. 5 is a block diagram illustrating the configuration of a Viterbi detector according to a second embodiment of the present invention.
Figure 6:
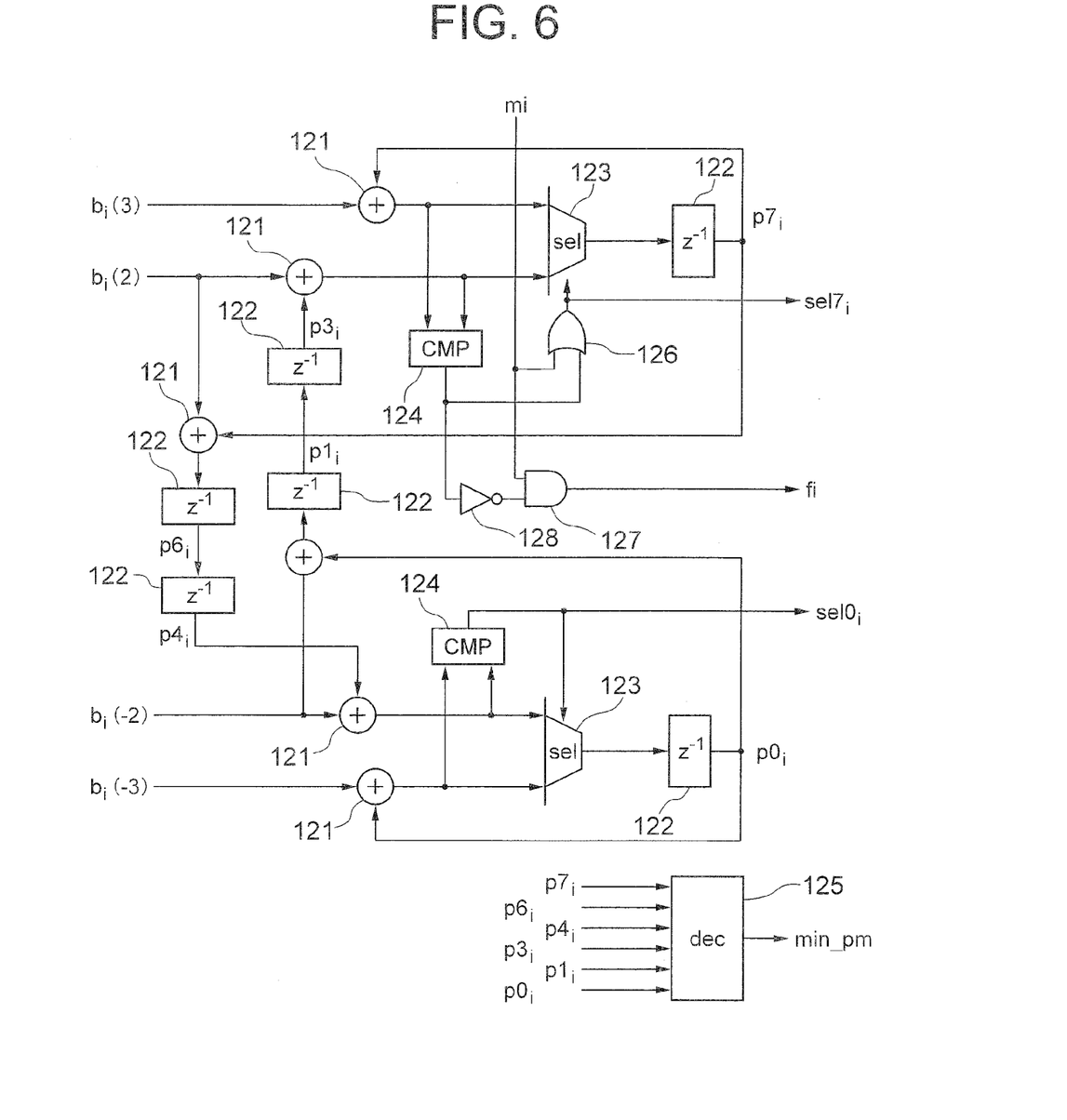
FIG. 6 is a circuit diagram illustrating the configuration of an ACS circuit in the second embodiment.

FIG. 5 illustrates a Viterbi detector according to a second embodiment of the present invention. The Viterbi detector of the present embodiment includes an ACS circuit 12a. In addition to the functions of the ACS circuit 12 illustrated in FIG. 1, the ACS circuit 12a has the function of outputting a signal f$_i$ that assumes true when a mark can be correctly detected by level detection and may be decided to be a space if based on path metrics alone. FIG. 6 illustrates the configuration of the ACS circuit 12a. The configuration illustrated in FIG. 6 is that of the ACS circuit 12 illustrated in FIG. 2 to which an inverter 128 for inverting the result of comparison between P7$_{i-1}$+b$_i$(3) and P3$_{i-1}$+b$_i$(2), output from the comparator 124, and an AND circuit 127 for outputting the logical product of the signal mi and the output of the inverter 128 are added. The AND circuit 127 is the section that constitutes a distortion decision circuit in the ACS circuit 12a.

The output signal fi of the AND circuit 127 is true if the output mi of the AND circuit 18 is true and the output of the comparator 124 is false, i.e., if P7$_{i-1}$+b$_i$(3)>P3$_{i-1}$+b$_i$(2). In other words, the signal $f_i$ is true if there remains a mark-continuing path and the input value two clocks earlier is higher than α and yet the result of comparison between path metrics implies that a space-including path is likely. The AND circuit 127 corresponds to a decision circuit that decides whether or not a mark-continuing path is selected under the condition that the mark-continuing path is not to be selected by path decision based on path metric values.

A counter 20 (FIG. 5) accumulates the signal fi output from the AND circuit 127 for a period that is determined by a timing generator 19. The counter 20 corresponds to an integrator circuit that integrates the result of decision output from the decision circuit. The signal fi integrated by the counter 20 is latched by a latch circuit 21. The latch circuit 21 corresponds to a distortion-factor output circuit that outputs the result of accumulation by the integrator as a mark distortion factor. In the present embodiment, the distortion-factor output circuit can be made of the latch circuit for simplified circuit configuration. A higher value for the result of accumulation provides a higher frequency of occurrence of the mark distortion. The result of accumulation is almost zero if there is little distortion. The result of accumulation can thus be used to determine the mark distortion factor of the reproduced waveform.

Figure 7:
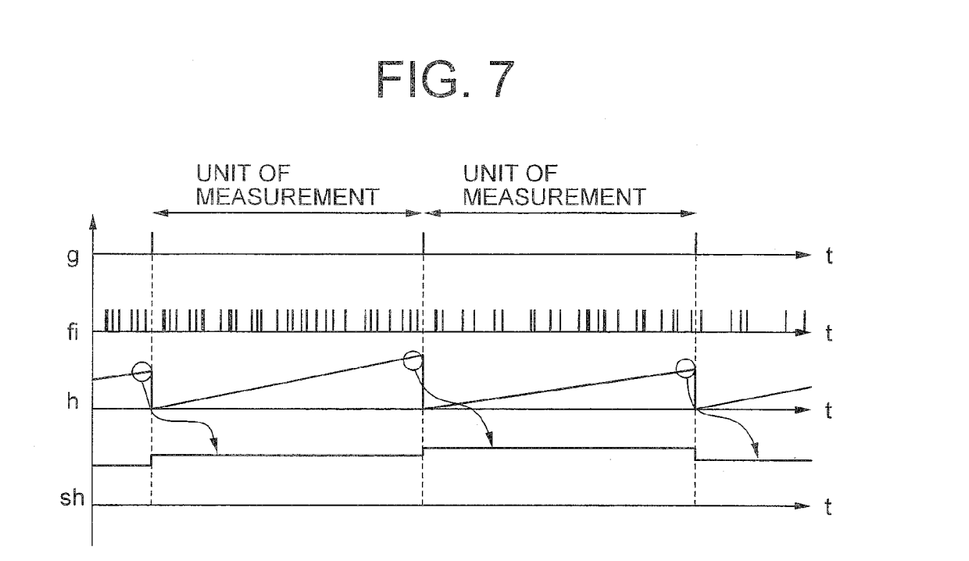
FIG. 7 is a waveform chart illustrating the operating waveforms of respective sections.

FIG. 7 illustrates the operating waveforms of various sections. The timing generator 19 generates a signal "g" at specified cycles. The signal g is used as a clear signal clr of the counter 20. A single cycle of the signal g is the period for which the counter 20 measures the signal $f_i$. The counter 20 resets its value in response to the pulsed signal of the signal g, and counts up the count each time the signal $f_i$ occurs. The signal $f_i$ assumes true when a path selection that is made based on the path metrics does not match with that based on the amplitude value two clocks earlier. The count h of the counter 20 therefore corresponds to the number of mismatches occurring in the measuring period. The measurement of the number of occurrence of mismatches "h" is latched by the latch circuit 21 and output as a signal sh. Since the information recorded on an optical disk and the like is modulated by a modulation code, the frequency of occurrence of a certain mark length is constant irrespective of whether or not it is a long mark. Accordingly, if a period has a certain length or more, the measurement of the number of mismatches h will not vary greatly depending on the timing of measurement.

In addition to the configuration of the first embodiment, the present embodiment employs the configuration of deciding whether or not a mark-continuing path is selected under the condition that the mark-continuing path is not to be selected by path decision based on path metric values, accumulating the result of decision, and outputting the resultant value as a mark distortion factor. When the information reproducing apparatus performs information reproducing based on the result of detection by the Viterbi detector, a high waveform distortion could increase equalization errors and make the adaptive equalizer unstable in operation. If, for example, the mark distortion factor output from the latch circuit 21 reaches or exceeds a specified threshold value, a processing such as initializing the tap coefficients of the adaptive equalizer is performed for achieving system stabilization. The mark distortion factor may be used to switch the operating states of various filters including the offset compensator.

There are information recording media in which marks have a higher reflectance than that of spaces, and ones in which marks have a lower reflectance than that of spaces. The Viterbi detector of the present invention is applicable to both types of media. Note that such media provide reproduced signal waveforms of inverted configuration for marks and spaces. When the intended media type is changed, the reproduced signal waveform illustrated in FIG. 12 is thus appropriately inverted for application.

While the invention has been particularly shown and described with reference to exemplary embodiment thereof, the invention is not limited to these embodiments and modifications. As will be apparent to those of ordinary skill in the art, various changes may be made in the invention without departing from the spirit and scope of the invention as defined in the appended claims.

This application is based upon and claims the benefit of priority from Japanese patent application No. 2007-129360 filed on May 15, 2007, the disclosure of which is incorporated herein in its entirety by reference.

The invention claimed is:

1. A Viterbi detector for identifying recorded data in a reproduced signal from an information recording medium, comprising:
   a branch-metric calculation unit that calculates branch metric values corresponding to the reproduced signal and a plurality of possible paths;
   a path metric calculator that includes an adder that adds a path metric value currently retained and the branch metric values corresponding to the reproduced signals of a plurality of possible paths, a comparator that compares results of addition by the adder corresponding to the plurality of possible paths with one another, a path selection circuit that refers to a result of comparison by the comparator and selects a single path out of the plurality of possible paths, and an update unit that updates the retained path metric value by the result of addition corresponding to the single path; and
   a decision circuit that performs a path decision based on the path metric value currently retained by the path metric calculator and the reproduced signal at a specific time instant that is a specified number of channel clocks earlier, wherein:
   the path selection circuit selects the single path based on the result of comparison by the comparator and a result of decision by the decision circuit, the Viterbi detector further comprising: decision means that decides whether or not a result of selection by the path selection circuit selected a mark-continuing path under the condition that the result of selection by the path selection circuit is not used to select the mark-continuing path, a counter that counts results of decision by the decision means, and a distortion decision circuit that calculates a mark distortion factor based on a result of count by the counter.

2. A Viterbi detection method for identifying recorded data in a reproduced signal from an information recording medium, the method comprising:
   a path decision that selects a single path out of a plurality of paths based on a path metric value calculated from the reproduced signal and the reproduced signal at a specific time instant that is a specified number of channel clocks earlier,
   judging whether or not a mark-continuing path is selected; and
   accumulating results of the judgment to output a result of accumulation as a mark distortion factor.

3. An information reproducing apparatus comprising:
   a signal reproduction unit that generates a reproduced signal from an information recording medium;
   a branch-metric calculation unit that calculates branch metric values corresponding to the reproduced signal and a plurality of possible paths;

a path metric calculator that includes an adder that adds a path metric value currently retained and the branch metric values corresponding to the reproduced signals of a plurality of possible paths, a comparator that compares results of addition by the adder corresponding to the plurality of possible paths with one another, a path selection circuit that refers to a result of comparison by the comparator and selects a single path out of the plurality of possible paths, and an update unit that updates the currently retained path metric value by the result of addition corresponding to the single path; and a decision circuit that performs a path decision based on the path metric value currently retained by the path metric calculator and an amplitude of the reproduced signal at a specific time instant that is a specified number of channel clocks earlier, wherein:

the path selection circuit selects the single path based on the result of comparison by the comparator and a result of decision by the decision circuit; further comprising:

a decision means that decides whether or not a result of selection by the path selection circuit selected a mark-continuing path under the condition that the result of select by the path selection circuit is not used to select the mark-continuing path, a counter that counts results of judgement by the decision means, and a distortion-factor calculation circuit that calculates a mark distortion factor based on a result of count by the counter.

* * * * *